(12) United States Patent
Hsieh et al.

(10) Patent No.: US 8,242,943 B2
(45) Date of Patent: Aug. 14, 2012

(54) DIGITAL-TO-ANALOG CONVERTER

(75) Inventors: Wen-Hung Hsieh, Kaohsiung (TW); Chung-Chih Hung, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 130 days.

(21) Appl. No.: 12/814,780

(22) Filed: Jun. 14, 2010

(65) Prior Publication Data

US 2011/0175763 A1 Jul. 21, 2011

(30) Foreign Application Priority Data

Jan. 18, 2010 (TW) .............................. 99101290 A

(51) Int. Cl.
*H03M 1/66* (2006.01)
(52) U.S. Cl. .................. 341/144; 375/257; 375/259
(58) Field of Classification Search .......... 341/140–165; 375/257, 259
See application file for complete search history.

(56) References Cited

U.S. PATENT DOCUMENTS

| | | | |
|---|---|---|---|
| 6,778,110 B2* | 8/2004 | Jansson | 341/120 |
| 6,961,385 B2* | 11/2005 | Plisch et al. | 375/259 |
| 6,963,616 B2* | 11/2005 | Chan | 375/257 |
| 7,030,799 B2* | 4/2006 | Lee et al. | 341/144 |
| 7,825,844 B2* | 11/2010 | Ballantyne | 341/144 |
| 7,956,785 B2* | 6/2011 | Baek et al. | 341/144 |

\* cited by examiner

*Primary Examiner* — Lam T Mai
(74) *Attorney, Agent, or Firm* — Rosenberg, Klein & Lee

(57) ABSTRACT

The present invention relates to a digital-to-analog converter comprising a differentiation circuit, a conversion circuit, and an integration circuit. The differentiation circuit receives and differentiates a digital signal for producing a differentiation signal. The conversion circuit is coupled to the differentiation circuit. It receives the differentiation signal and produces a conversion signal according to a clock signal and the differentiation signal. The integration circuit is coupled to the conversion circuit. It receives and integrates the conversion signal for producing an analog signal. Thereby, the purpose of reducing distortion noises can be achieved.

15 Claims, 10 Drawing Sheets

DIGITAL-TO-ANALOG CONVERTER

FIELD OF THE INVENTION

The present invention relates generally to a converter, and particularly to a digital-to-analog converter.

BACKGROUND OF THE INVENTION

At present, microcomputer systems own the capabilities of high-speed computing and storing data. In modern electrical systems, controllers composed of microcomputers have already replaced the past purely mechanical or electrical-mechanical control mechanisms. The signals inside a microcomputer are digital, which is represented by logic "0" or "1". Logic "0" represents a low voltage level, which is generally 0 volt in the microcomputer system; logic "1" represents a high voltage level, which is generally 5 volts in the microcomputer system. However, in the physical world, physical quantities usually exhibit continuous analog signals. Thereby, for transmitting the variation of external physical quantities to a microcomputer for operations, or for driving devices by outputting commands from a microcomputer, it is required to convert the signals.

General continuous signals such as measured voltage or current are analog signals. The converter converting analog signals to digital signals is called an analog-to-digital converter (ADC), which can be classified according to the conversion methods into digital-ramp ADCs, successive approximation ADCs, flash ADCs, and tracking ADCs. These ADCs can acquire analog signals, process the analog signals, and convert them to digital signal.

On the other hand, a digital-to-analog converter (DAC) is a common circuit element in various electronic apparatuses. DACs produce corresponding analog outputs according digital inputs for backend circuits. DACs rely on unit elements (resistors, capacitors, or current sources) for converting. However, mismatches must exist among components, particularly for integrated circuits. For current-controlled DACs in high-speed and high-resolution applications, mismatches among current sources pose a serious problem, which will result in distortion noises. For suppressing the distortion noises, the technique of dynamic element matching (DEM) is applied. Nevertheless, for applications requiring a larger number of conversion bits or faster conversion speed, DEM cannot suppress the distortion noises effectively. Thereby, how to reduce the distortion noises in DACs has become the most important issue in the present day.

Accordingly, the present invention provides a DAC, which can reduce the distortion noises, and hence the problems occurred in the prior art as described above can be solved.

SUMMARY

An objective of the present invention is to provide a digital-to-analog converter (DAC), which uses a differentiation circuit and an integration circuit for saving the area of hardware circuits, and hence reducing the cost of manufacturing chips in products.

Another objective of the present invention is to provide a DAC, which avoids using a dynamic element matching circuit for saving the area of hardware circuits, and hence reducing the cost of manufacturing chips in products.

Still another objective of the present invention is to provide a DAC, which uses a conversion circuit to receive a differentiation signal, and produces a conversion signal according to a clock signal and the differentiation signal. The digital-to-analog converter receives the conversion signal to produce an analog signal. Thereby, distortion noises can be reduced.

The DAC according to the present invention comprises a differentiation circuit, a conversion circuit, a digital-to-analog conversion circuit, and an integration circuit. The differentiation circuit receives a digital signal, and produces a differentiation signal by differentiating the digital signal. The conversion circuit is coupled to the differentiation circuit. It receives the differentiation signal produced by the differentiation circuit, and produces a conversion signal according to a clock signal and the differentiation signal. The integration circuit is coupled to the conversion circuit. It receives and integrates the conversion signal for producing an analog signal. Thereby, the differentiation circuit and the integration circuit are combined for saving the area of hardware circuits, and hence reducing the cost of manufacturing chips in products. In addition, dynamic element matching circuits are avoided for further saving the area of hardware circuits, and hence further reducing the cost of manufacturing chips in products. Moreover, it is not necessary to use unit elements, and hence achieving the purpose of reducing distortion noises.

Besides, the DAC according to the present invention further comprises a digital front-end circuit, which is coupled to the differentiation circuit and produces a digital signal.

DETAILED DESCRIPTION

In order to make the structure and characteristics as well as the effectiveness of the present invention to be further understood and recognized, the detailed description of the present invention is provided as follows along with embodiments and accompanying figures.

Figure 1:
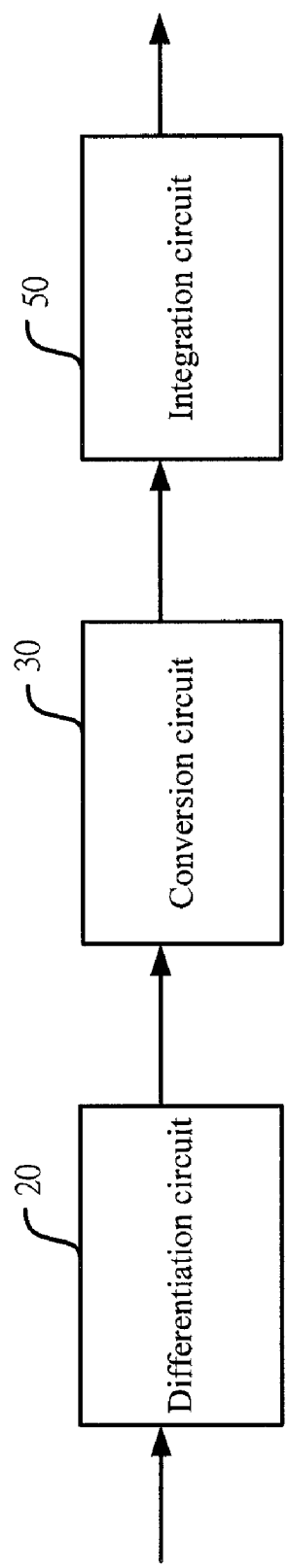
FIG. 1 shows a block diagram of a DAC according to a preferred embodiment of the present invention.

FIG. 1 shows a block diagram of a DAC according to a preferred embodiment of the present invention. As shown in the figure, the DAC according to the present invention comprises a differentiation circuit 20, a conversion circuit 30, and an integration circuit 50. The differentiation circuit 20 receives a digital signal and differentiates the digital signal for producing a differentiation signal. The conversion circuit 30 is coupled to the differentiation circuit 20 for converting the differentiation signal produced by the differentiation circuit 20, and produces a conversion signal. The integration circuit 50 is coupled to the conversion circuit 30. It receives the conversion signal, and integrates the conversion signal for producing an analog signal. Thereby, the differentiation circuit 20 and the integration circuit 50 are combined for saving the area of hardware circuits, and hence reducing the cost of manufacturing chips in products.

The differentiation circuit 20 of the DAC according to the present invention receives the digital signal and produces the differentiation signal. The conversion circuit 30 converts the differentiation signal and produces the conversion signal, which is further converted to the analog signal. Then the integration circuit 50 integrates the analog signal and outputs the resulting signal. Thereby, the conversion circuit 30 according to the present invention avoids using a dynamic element matching circuit, saving the area of hardware circuits and hence reducing distortion noises. Consequently, the present invention can reduce the distortion noises in DACs as well as reducing the number of bits and hardware. The conversion circuit 30 of the DAC according to the present invention is a PCM-to-QPWM converter. A preferred embodiment of the digital signal is a pulse-code modulation (PCM) signal; a preferred embodiment of the conversion signal is a quantized pulsed-width modulation (QPWM) signal. Besides, a preferred embodiment of the integration circuit 50 is an analog integration circuit or a charge pump.

Figure 2:
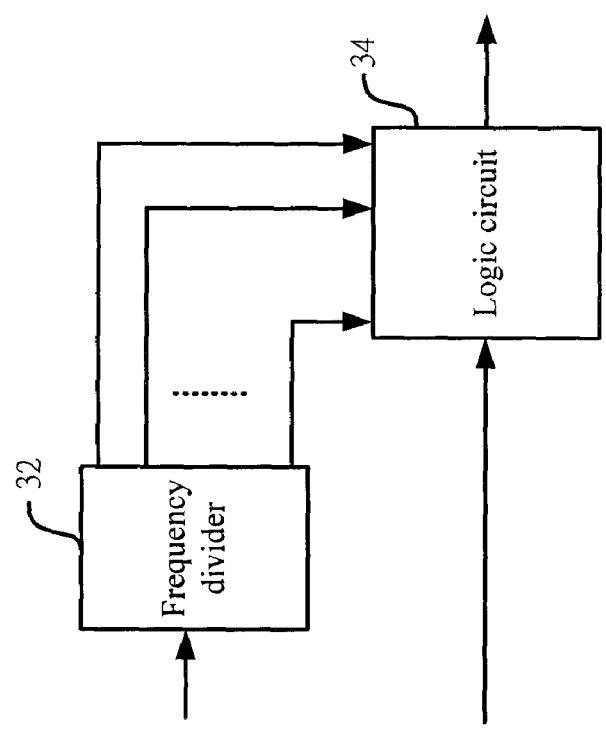
FIG. 2 shows a block diagram of a conversion circuit according to a preferred embodiment of the present invention.

FIG. 2 shows a block diagram of a conversion circuit according to a preferred embodiment of the present invention. As shown in the figure, the conversion circuit 30 according to the present invention includes a frequency divider 32 and a logic circuit 34. The frequency divider 32 receives a clock signal, and produces a frequency-dividing signal by down-converting the clock signal. Namely, the clock signal received by the frequency divider 32 can be any clock signal in the system applying the DAC according to the present invention. Thereby, power consumption can be reduced by down-converting the clock signal. The frequency divider 32 described above is a technique known by the person having ordinary skill in the art, and hence will not be described any further. The logic circuit 34 is coupled to the differentiation circuit 20 and the frequency divider 32. It receives the clock signal and the differentiation signal and produces a conversion signal. That is to say, the logic circuit 34 controls the clock signal according to the differentiation signal for producing the conversion signal.

Figure 3:
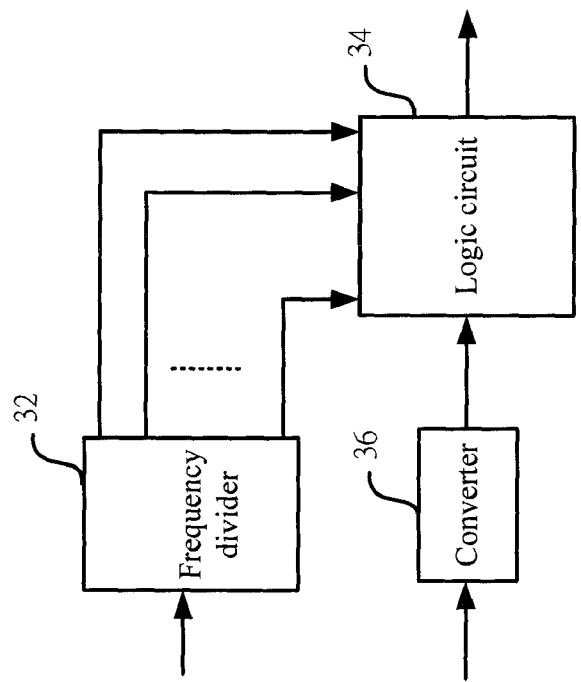
FIG. 3 shows a block diagram of a conversion circuit according to another preferred embodiment of the present invention.

FIG. 3 shows a block diagram of a conversion circuit according to another preferred embodiment of the present invention. As shown in the figure, the difference between the conversion circuit 30 according to the present embodiment and the one in FIG. 2 is that, according to the present embodiment, a converter 36 is further included. The converter 36 is coupled to the differentiation circuit 20 and the logic circuit 34 for converting the differentiation signal produced by the differentiation circuit 20, and for inputting the differentiation signal to the logic circuit 34. In other words, the conversion circuit 34 converts the differentiation signal to a signal in a different representation. According to a preferred embodiment, the conversion circuit 36 is a sign-and-magnitude converter, which converts the differentiation signal to a sign-and-magnitude signal from a binary signal.

Figure 4:
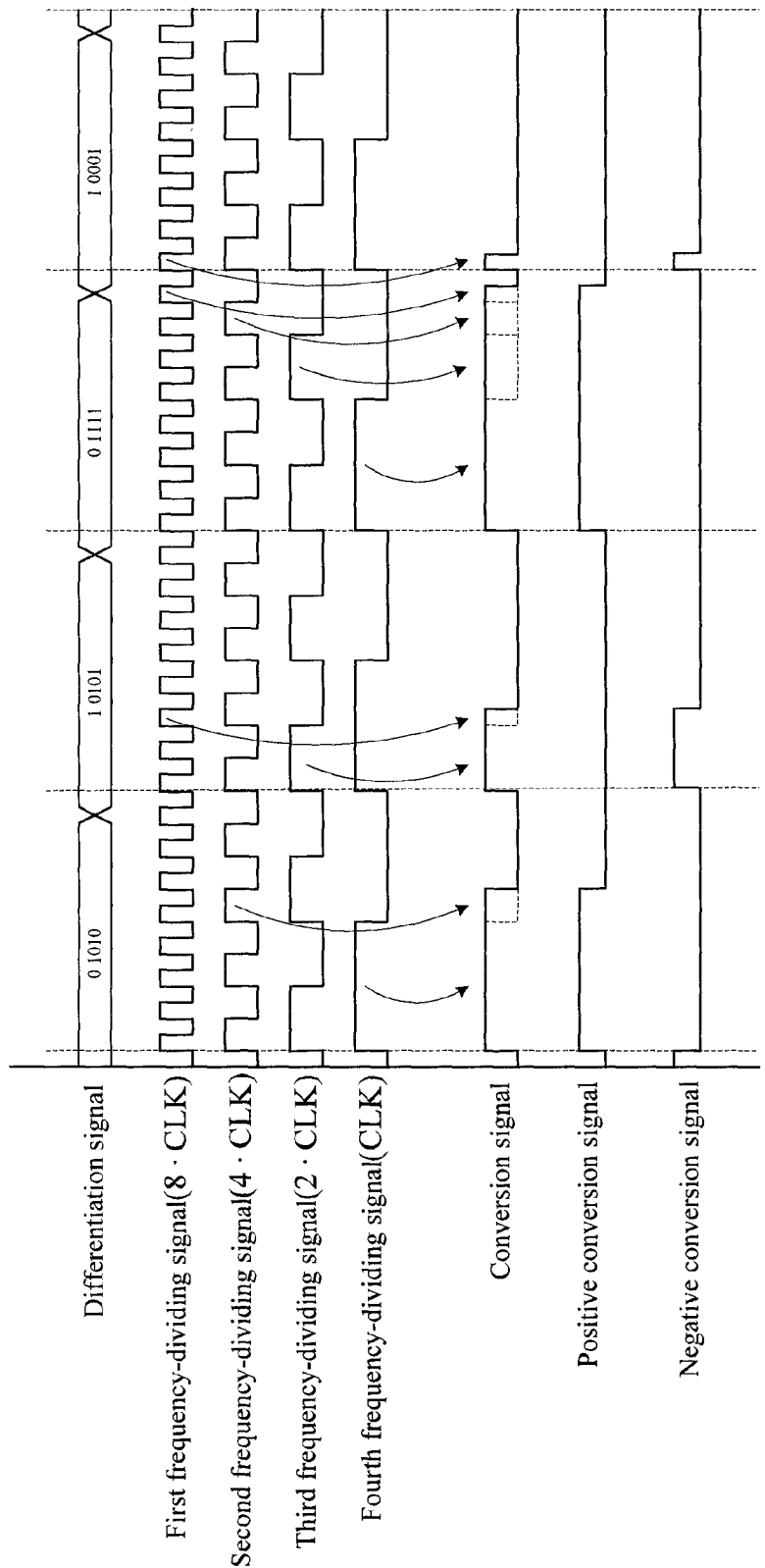
FIG. 4 shows a timing diagram of a logic circuit according to a preferred embodiment of the present invention.

FIG. 4 shows a timing diagram of a logic circuit according to a preferred embodiment of the present invention. As shown in the figure, the differentiation signal received by the logic circuit according to the present embodiment is a 5-bit number, namely, 0 0001~1 1111. The 0 and 1 in the first bit of the differentiation signal represent integration upwards and downwards, respectively. The frequency divider 32 divides the frequency of the clock signal and produces a plurality of frequency-dividing signals. The frequencies of the plurality of frequency-dividing signals are different. According to the present embodiment, for corresponding to the second to the fifth digits of the differentiation signal, the frequency divider 32 produces four frequency-dividing signals. The frequency of each of the four frequency-dividing signals is twice the frequency of the previous frequency-dividing signal. That is, the frequency divider 32 produces a first frequency-dividing signal, a second frequency-dividing signal, a third frequency-dividing signal, and a fourth frequency-dividing signal. The frequency of the first frequency-dividing signal is twice the frequency of the second frequency-dividing signal; the frequency of the second frequency-dividing signal is twice the frequency of the third frequency-dividing signal; and the frequency of the third frequency-dividing signal is twice the frequency of the fourth frequency-dividing signal. Thereby, the logic circuit 34 extracts the plurality of frequency-dividing signals according to the differentiation signal for producing the conversion signal. As shown in FIG. 4, when the second to the fifth digits are 1010, the logic circuit 34 extracts a waveform of the second frequency-dividing signal and a waveform of the fourth frequency-dividing signal for producing the conversion signal. Likewise, when the second to the fifth digits are 0101, the logic circuit 34 extracts a waveform of the first frequency-dividing signal and a waveform of the third frequency-dividing signal for producing the conversion signal. Accordingly, the logic circuit 34 produces the conversion signals with different turn-on times according to the amplitude of the differentiation signal (for example, 0000, 0101).

Figure 5:
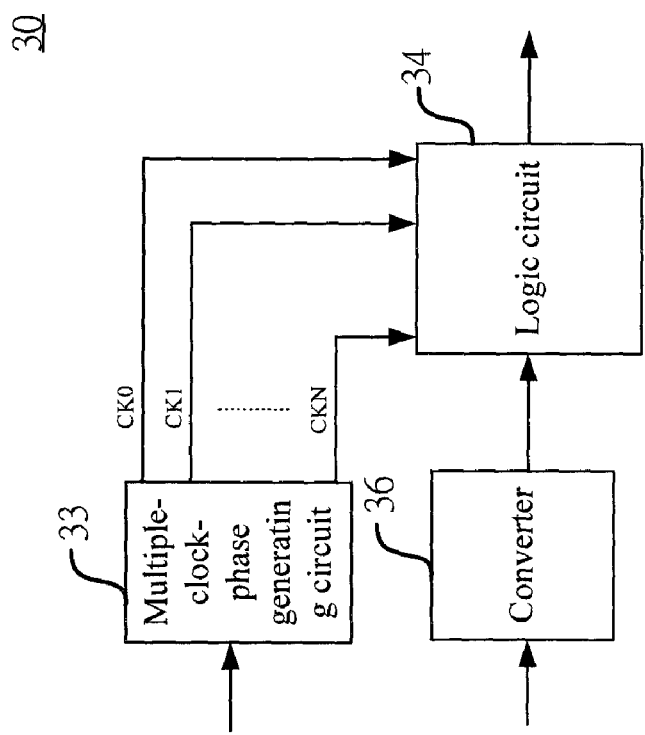
FIG. 5 shows a block diagram of a conversion circuit according to another preferred embodiment of the present invention.

FIG. 5 shows a block diagram of a conversion circuit according to another preferred embodiment of the present invention. As shown in the figure, the difference between the present embodiment and the one in FIG. 3 is that the conversion circuit 30 according to the present embodiment includes a multiple-clock-phase generating circuit 33 for replacing the frequency divider 32. The multiple-clock-phase generating circuit 33 generates a plurality of reference clock signals with different phases. The logic circuit 34 is coupled to the differentiation circuit and the multiple-clock-phase generating circuit 33. The logic circuit 34 receives the plurality of reference clock signals and the differentiation for producing the conversion signal. Besides, the multiple-clock-phase generating circuit 33 is a delay-locked loop.

Figure 6:
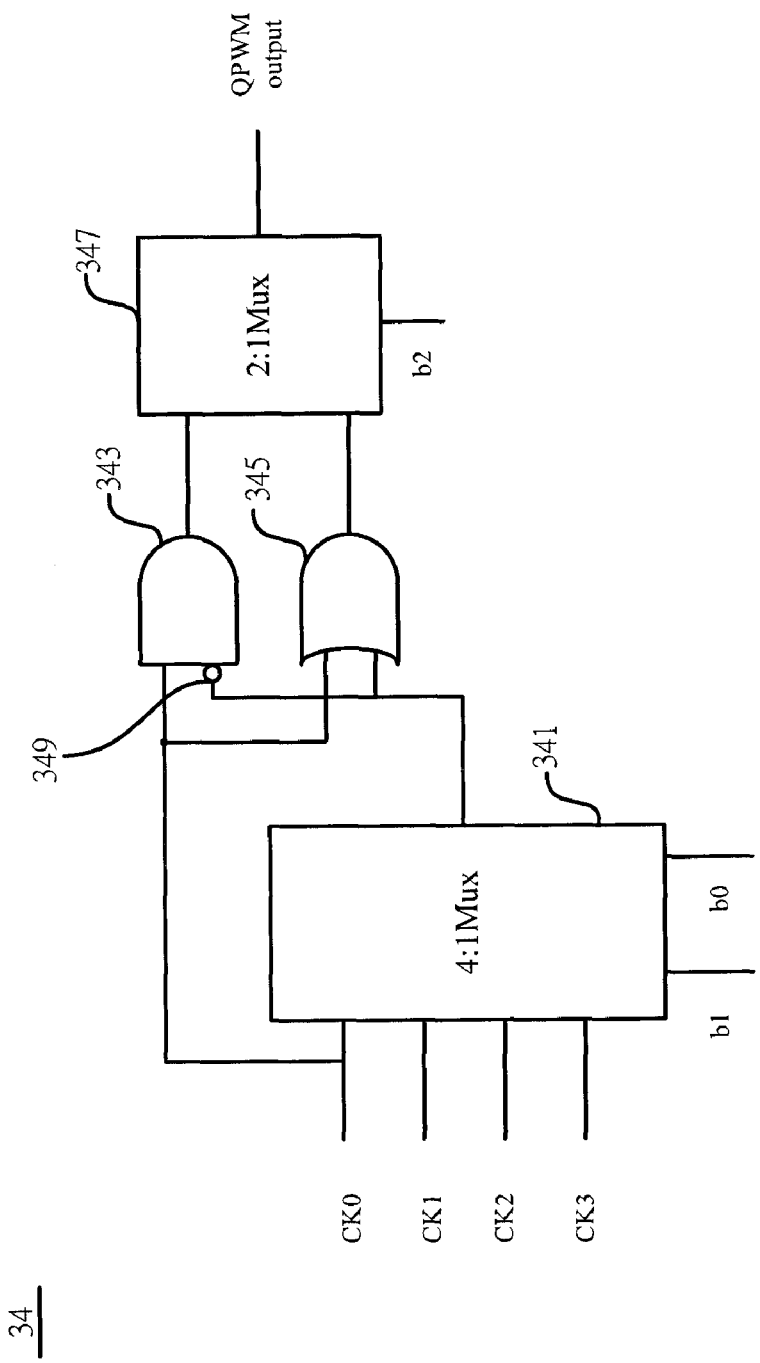
FIG. 6 shows a block diagram of a logic circuit according to a preferred embodiment of the present invention.

FIG. 6 shows a block diagram of a logic circuit according to a preferred embodiment of the present invention. As shown in the figure, the logic circuit 34 according to the present invention comprises a first selection unit 341, a first logic gate 343, a second logic gate 345, and a second selection unit 347. The first selection unit 341 receives the differentiation signal and the clock signal produced by the differentiation circuit 20, and outputs the clock signal according to the differentiation signal. In other words, the first selection unit 341 receives a plurality clock signals and the differentiation signal, and selects to output one of the plurality of clock signals according to the differentiation signal. The first logic gate 343 has a first input terminal, a second input terminal, and an output terminal. The first input terminal of the first logic gate 343 receives the clock signal; the second input terminal of the first logic gate 343 receives the inverse signal of the clock signal output by the first selection unit 341. Besides, the output terminal of the first logic gate 343 outputs the clock signal and the inverse clock signal, and produces a first logic signal. The second logic gate 345 has a first input terminal, a second input terminal, and an output terminal. The first input terminal of the second logic gate 345 receives the clock signal; the second input terminal of the second logic gate 345 receives the clock signal output by the first selection unit 341, and produces a second logic signal, which is output by the output terminal of the second logic gate 345. The second selection unit 347 receives the first and the second logic signals, and output the conversion signal according to the differentiation signal. Namely, the second selection unit 347 selects the first logic signal or the second logic signal to output according to the differentiation signal. According to a preferred embodiment of the present invention, the first and second selection units 341, 347 are multiplexers; the first logic gate 343 is an AND gate; the second logic gate 345 is an OR gate. Accordingly, the use of high clock rates can be avoided, and hence suitable for high-speed DACs.

In addition, the logic circuit 34 of the DAC according to the present invention further comprises an inverter 349 for inverting the clock signal output by the first selection unit 341, and transmitting the inverse clock signal to the first logic gate 343.

Figure 7:
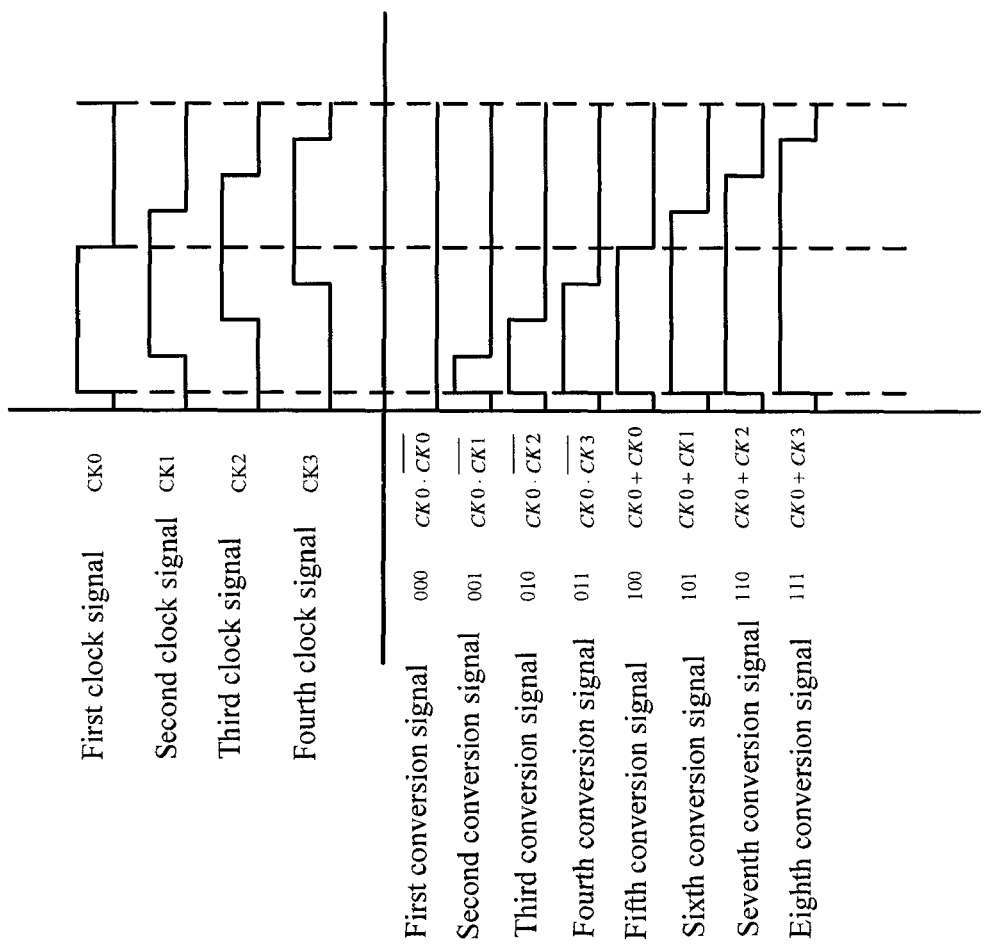
FIG. 7 shows a timing diagram of a logic circuit according to a preferred embodiment of the present invention.

FIG. 7 shows a timing diagram of a logic circuit according to a preferred embodiment of the present invention. As shown in the figure, the logic circuit 34 according to the present invention receives a plurality of clock signal and the differentiation signal. According to the present embodiment, the logic circuit 34 receive a first clock signal CK0, a second clock signal CK1, a third clock signal CK2, and a fourth clock signal CK3; the differentiation signal received by the logic circuit 34 is a 3-bit signal (000~111). The logic circuit 34 operates logically the plurality of clock signals (CK0~CK3) according to the bits represented by the differentiation signal for producing the conversion signal. When the differentiation signal is 000, it represents that a first conversion signal is produced by multiplying the first clock signal CK0 by the inverse signal of the first clock signal CK0. The first selection unit 341 selects one of the first, second, third, and fourth clocks signals CK0, CK1, CK2, CK3 for outputting according to the first two least significant bits of the differentiation signal. According to the present embodiment, the first two least significant bits are 00, therefore the first selection unit 341 outputs the first clock signal CK0. The first logic gate 343 operates logically for multiplying the first clock signal CK0 by the inverse signal of the first clock signal CK0 and produces the first conversion signal, which is then output via the second selection unit 347.

Likewise, when the differentiation signal is 001, it represents that a second conversion signal is produced by multiplying the second clock signal CK1 by the inverse signal of the second clock signal CK1; when the differentiation signal is 010, it represents that a third conversion signal is produced by multiplying the third clock signal CK2 by the inverse signal of the third clock signal CK2; and when the differentiation signal is 011, it represents that a fourth conversion signal is produced by multiplying the fourth clock signal CK3 by the inverse signal of the fourth clock signal CK3.

When the differentiation signal is 100, it represents that a fifth conversion signal is produced by adding the first clock signal CK0 and the first clock signal CK0. Namely, the second logic gate 345 operates logically for adding the first clock signal CK0 and the first clock signal CK0, and produces the fifth conversion signal, which is then output via the second selection unit 347. Likewise, when the differentiation signal is 101, it represents that a sixth conversion signal is produced by adding the first clock signal CK0 and the second clock signal CK1; when the differentiation signal is 110, it represents that a seventh conversion signal is produced by adding the first clock signal CK0 and the third clock signal CK2; and when the differentiation signal is 111, it represents that a eighth conversion signal is produced by adding the first clock signal CK0 and the fourth clock signal CK3.

It is thereby known from the description above that the second selection unit 347 selects the first logic gate 343 or the second logic gate 345 for outputting according to the most significant bit of the differentiation signal. In addition, the logic circuit 34 according to the present invention produces conversion signals with various pulse widths according to the differentiation signal for subsequent circuits.

Figure 8:
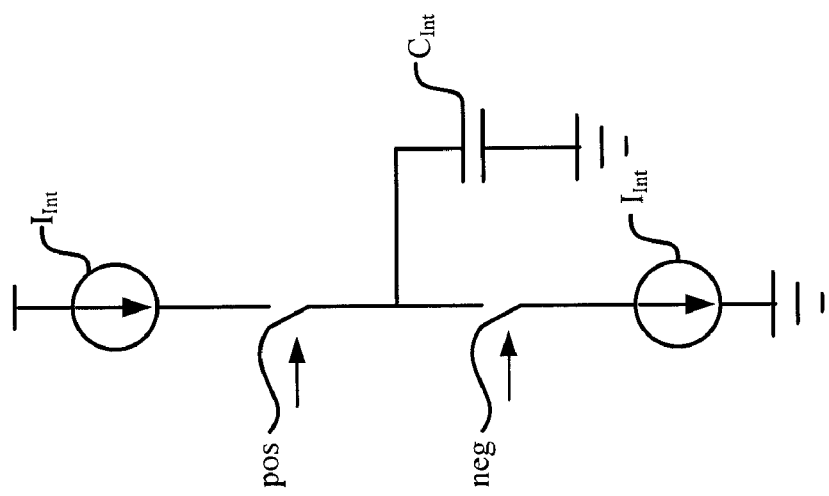
FIG. 8 shows a circuit diagram of an integration circuit according to a preferred embodiment of the present invention.

FIG. 8 shows a circuit diagram of an integration circuit according to a preferred embodiment of the present invention. As shown in the figure and FIG. 4, the integration circuit 50 according to the present invention further includes a first current source $I_{Int1}$, a first switch pos, a second switch neg, an output capacitor $C_{Int}$, and a second current source $I_{Int2}$. The first switch pos is coupled to the first current source $I_{Int1}$, which provides a current to the first switch pos. The second switch neg is coupled to the first switch pos; a terminal of the output capacitor $C_{Int}$ is coupled between the first switch pos and the second switch neg; the other terminal of the output capacitor $C_{Int}$ is coupled to the ground. One terminal of the second current source $I_{Int2}$ is coupled to the second switch neg; and the other terminal thereof is coupled to the ground. The first and second switches pos, neg are controlled by the conversion signal, which includes a positive conversion signal and a negative conversion signal. The positive conversion signal is used for controlling the first switch pos; the negative conversion signal is used for controlling the second switch neg. As shown in FIG. 4, when the first bit of the differentiation signal is 0, the negative conversion signal disabled for turning off the second switch neg. When the voltage level of the positive conversion signal is positive, the first switch pos is turned on, and the current will flow from the first current source $I_{Int1}$ and charge the output capacitor $C_{Int}$, which increases the output voltage of the integration circuit 50. Likewise, when the first bit of the differentiation signal is 1, the positive conversion signal is disabled for turning off the first switch pos. When the voltage level of the negative conversion signal is positive, the second switch neg is turned on for discharging the output capacitor $C_{Int}$, which decreases the output voltage of the integration circuit 50. Thereby, the purpose of low power consumption can be achieved.

Figure 9:
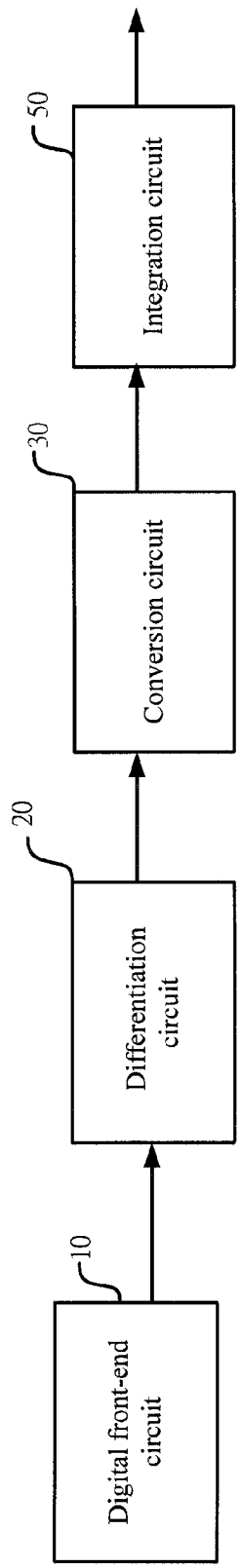
FIG. 9 shows a block diagram of a DAC according to another preferred embodiment of the present invention.

FIG. 9 shows a block diagram of a DAC according to another preferred embodiment of the present invention. As shown in the figure, the difference between the present embodiment and the one in FIG. 1 is that, according to the present embodiment, a digital front-end circuit 10 is further included. The digital front-end circuit 10 is coupled to the differentiation circuit 20 for producing a digital signal and transmitting it to the differentiation circuit 20. In addition, the digital front-end circuit 10 is a PCM circuit according to a preferred embodiment of the present invention.

Figure 10:
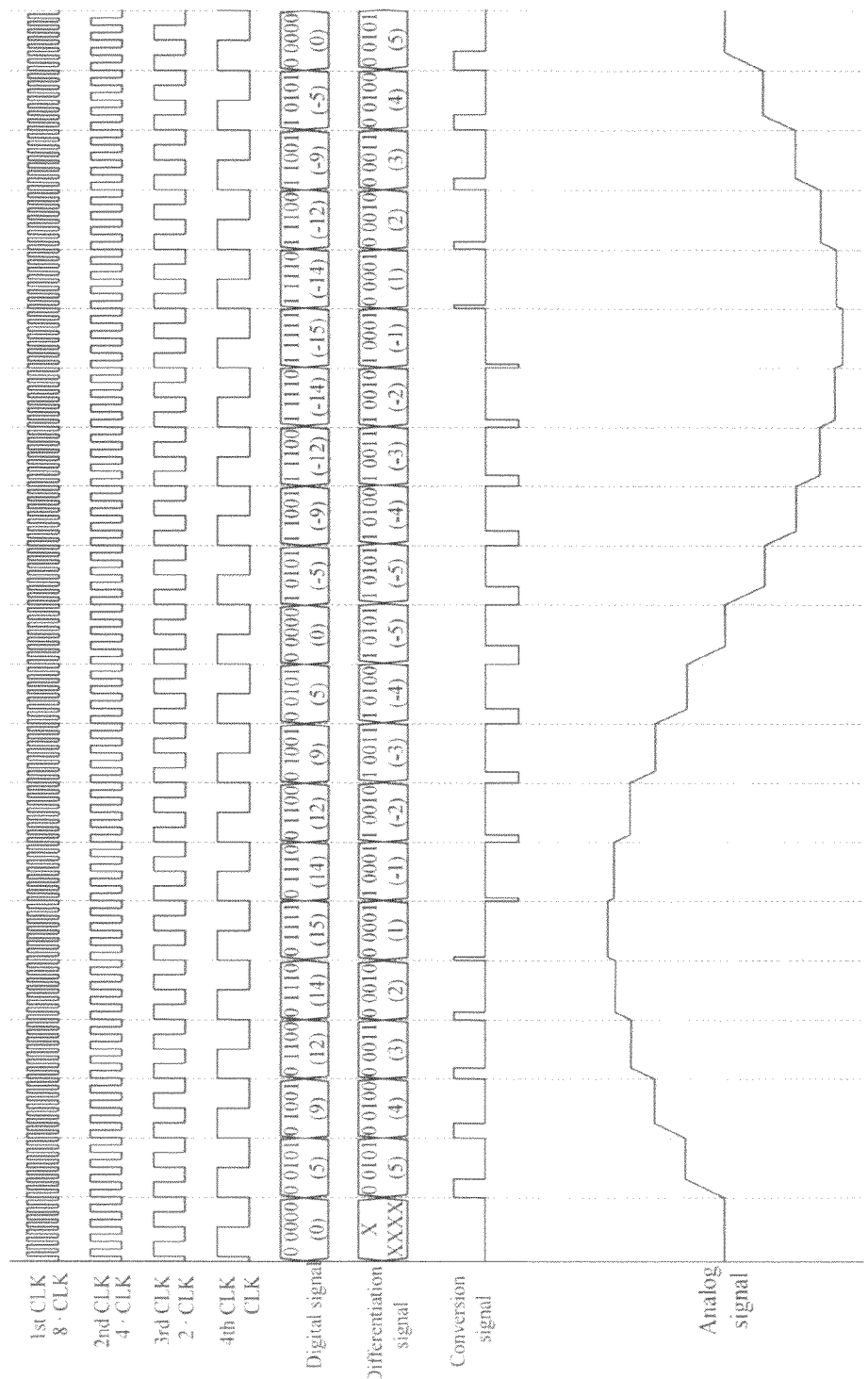
FIG. 10 shows a timing diagram of a DAC according to a preferred embodiment of the present invention.

FIG. 10 shows a timing diagram of a DAC according to a preferred embodiment of the present invention. As shown in the figure, when the conversion signal is positive, the output voltage of the integration circuit 50 increases, which means that the output voltage of the DAC increases. On the other hand, when the conversion signal is negative, the output voltage of the integration circuit 50 decreases, which means that the output voltage of the DAC decreases. Moreover, the pulse width of the conversion signal determines the rise time or fall time of the output voltage of the integration circuit 50.

To sum up, the DAC according to the present invention comprises a differentiation circuit, a conversion circuit, and an integration circuit. The differentiation circuit receives a digital signal, and produces a differentiation signal by differentiating the digital signal. The conversion circuit receives the differentiation signal produced by the differentiation circuit, and produces a conversion signal according to a clock signal and the differentiation signal. The integration circuit is coupled to the conversion circuit. It integrates the conversion signal for outputting. Thereby, the differentiation circuit and the integration circuit are combined for saving the area of hardware circuits, and hence reducing the cost of manufacturing chips in products. In addition, dynamic element matching circuits are avoided for further saving the area of hardware circuits, and hence further reducing the cost of manufacturing chips in products. Moreover, it is not necessary to use unit elements, and hence achieving the purpose of reducing distortion noises.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

The invention claimed is:

1. A digital-to-analog converter, comprising:
   a differentiation circuit, receiving a digital signal, differentiating said digital signal, and producing a differentiation signal;
   a conversion circuit, coupled to said differentiation circuit, receiving said differentiation signal, and producing a conversion signal according to a clock signal and said differentiation signal, said conversion circuit further includes:
      a frequency divider, receiving said clock signal, down-converting said clock signal, and producing a frequency-dividing signal;
      a logic circuit, coupled to said differentiation circuit and said frequency divider, receiving said clock signal and said differentiation signal, and producing said conversion signal; and
   an integration circuit, coupled to said conversion circuit, receiving and integrating said conversion signal, and producing an analog signal.

2. The digital-to-analog converter of claim 1, wherein said integration circuit comprises:
   a first current source, providing a current;
   a first switch, coupled to said first current source, and receiving said current;
   a second switch, coupled to said first switch;
   an output capacitor, one terminal of said output capacitor coupled between said first switch and said second switch, and the other terminal of said output capacitor coupled to the ground; and
   a second current source, one terminal of said second current source coupled to said second switch, the other terminal of said second current source coupled to the ground, and said first switch and said second switch controlled by said conversion signal.

3. The digital-to-analog converter of claim 1, wherein said integration circuit is a charge pump.

4. The digital-to-analog converter of claim 1, wherein said conversion circuit further includes a converter, coupled to said differentiation circuit and said logic circuit, converting said differentiation signal, and outputting said differentiation signal to said logic circuit.

5. The digital-to-analog converter of claim 4, wherein said converter is a sign-and-magnitude converter.

6. The digital-to-analog converter of claim 1, wherein said logic circuit further comprises:

a first selection unit, receiving said differentiation signal and said clock signal, and outputting said clock signal according to said differentiation signal;
   a first logic gate, having a first input terminal, a second input terminal, and an output terminal, said first input terminal of said first logic gate receiving said clock signal, said second input terminal of said first logic gate receiving the inverse signal of said clock signal output by said first selection unit, and said output terminal of said first logic gate outputting a first logic signal;
   a second logic gate, having a first input terminal, a second input terminal, and an output terminal, said first input terminal of said second logic gate receiving said clock signal, said second input terminal of said second logic gate receiving said clock signal output by said first selection unit, and said output terminal of said second logic gate outputting a second logic signal; and
   a second selection unit, receiving said first logic signal and said second logic signal, and outputting said conversion signal according to said differentiation signal.

7. The digital-to-analog converter of claim 6, wherein said first selection unit and said second selection unit are multiplexers.

8. The digital-to-analog converter of claim 6, and further comprises an inverter, inverting said clock signal output by said first selection unit, and transmitting said inverse signal of said clock signal output by said first selection unit to said first logic gate.

9. The digital-to-analog converter of claim 6, wherein said first logic gate is an AND gate.

10. The digital-to-analog converter of claim 6, wherein said second logic gate is an OR gate.

11. The digital-to-analog converter of claim 1, wherein said digital signal is a pulse-code modulation signal.

12. The digital-to-analog converter of claim 1, wherein said conversion signal is a quantized pulse-width modulation signal.

13. The digital-to-analog converter of claim 1, wherein said integration signal is an analog integration circuit.

14. A digital-to-analog converter, comprising:
   a differentiation circuit, receiving a digital signal, differentiating said digital signal, and producing a differentiation signal;
   a conversion circuit, coupled to said differentiation circuit, receiving said differentiation signal, and producing a conversion signal according to a clock signal and said differentiation signal, wherein said conversion circuit further includes:
      a multiple-clock-phase generating circuit, receiving said clock signal, and producing a plurality of reference clock signals with different phases; and
      a logic circuit, coupled to said differentiation circuit and said multiple-clock-phase generating circuit, receiving said plurality of reference clock signals and said differentiation signal, and producing said conversion signal; and
   an integration circuit, coupled to said conversion circuit, receiving and integrating said conversion signal, and producing an analog signal.

15. The digital-to-analog converter of claim 14, wherein said conversion circuit further includes a converter, coupled to said differentiation circuit and said logic circuit, converting said differentiation signal, and outputting said differentiation signal to said logic circuit.

* * * * *